United States Patent [19]
Furumiya

[11] Patent Number: 5,323,034
[45] Date of Patent: Jun. 21, 1994

[54] CHARGE TRANSFER IMAGE PICK-UP DEVICE

[75] Inventor: Masayuki Furumiya, Tokyo, Japan

[73] Assignee: NEC Corporation, Tokyo, Japan

[21] Appl. No.: 47,426

[22] Filed: Apr. 15, 1993

[30] Foreign Application Priority Data

Apr. 15, 1992 [JP] Japan .................................. 4-95110

[51] Int. Cl.$^5$ .................... H01L 29/78; H01L 27/14; H01L 31/00
[52] U.S. Cl. ................................... 257/232; 257/220; 257/221; 257/223; 257/229; 257/233; 257/241
[58] Field of Search ............... 257/220, 221, 222, 223, 257/229, 230, 232, 233, 241

[56] References Cited

U.S. PATENT DOCUMENTS 5,063,581 11/1991 Akimoto et al. ...................... 377/58

FOREIGN PATENT DOCUMENTS 0185343 6/1986 European Pat. Off. .
62-213156 9/1987 Japan .................... 257/222

OTHER PUBLICATIONS

Toshifumi Ozaki et al., "A Proposal of a Highly Sensitive Interline CCD for HDTV", Extended Abstracts of the 1991 International Conf. on Solid State Devices and Materials, Yokohama, 1991, pp. 666-668.

Primary Examiner—Ngan Ngo
Attorney, Agent, or Firm—Sughrue, Mion, Zinn, Macpeak & Seas

[57] ABSTRACT

In a charge transfer image pick-up device including vertical registers and a horizontal register, impurity density of a well layer of the vertical registers is higher than that of a well layer of the horizontal register and a buried layer formed in the well layer of the vertical registers is composed of a first buried layer which is connected to a buried layer of the well layer of the horizontal register and a second buried layer formed on the first buried layer and having impurity density higher than that of the first buried layer, so that degradation of transfer efficiency of signal charge can be avoided and the manufacturing process can be simplified.

2 Claims, 4 Drawing Sheets

CHARGE TRANSFER IMAGE PICK-UP DEVICE

BACKGROUND OF THE INVENTION

1. Field of the Invention

The present invention relates to a charge transfer image pick-up device and a method of manufacturing the same and, more particularly, to an image pick-up device of this type including vertical registers and a horizontal register which are constituted with buried channel charge coupled devices (CCDs).

2. Description of the Prior Art

Although various proposals of a matrix type solid state image pick-up device had been reported in the early part of 1960s, none of them was realized. In 1970s, there was a considerable innovation in solid state image pick-up device owing to the development of MOS LSI technology and the development of charge transfer device and CCD. As a result, photo-electric conversion elements, charge storage elements and charge read-out elements which are to be arranged correspondingly to a number of pixels necessary for an image pick-up device were manufactured as LSI chips.

In 1980s, various characteristics thereof were considerably improved causing them to be practically usable and various applications of the solid state image pick-up device were also developed. Particularly, a CCD type image pick-up device utilizing charge transfer system was the most desirable device and an application thereof to HDTV (High Definition TV) is currently realized.

As disclosed in Extended Abstracts of the 1991 Internal Conference on Solid State Devices and Materials, Yokohama, 1991, p. 666 to 668, FIGS. 1 and 3, a CCD solid state image pick-up device is constituted basically with a plurality of vertical registers of CCDs, photo-electric converters arranged adjacent to respective registers constituting the vertical registers, transfer gates for controlling signal charge transfer from the photo-electric converters to corresponding vertical registers, respectively, a horizontal register electrically coupled to one ends of the vertical registers and a charge detector provided at one end of the horizontal register.

Such construction has been realized by forming, on a semiconductor substrate of one conductivity type, a well layer of the other conductivity type, forming, in the well layer, a buried layer of the one conductivity type and forming, on a main surface of the semiconductor layer, transfer electrodes of the vertical registers and transfer electrodes of the horizontal register on a gate insulating film covering the semiconductor substrate.

In general, in a buried channel type CCD, there is a tendency that the higher the impurity density of the well layer and the shallower the buried layer provides the larger the maximum amount of charge transfer. On the other hand, there is also a tendency that the lower the impurity density of the well layer provides the stronger the FIGURE electric field in the transfer direction and hence the higher the transfer efficiency.

However, since, in the conventional CCD type solid state image pick-up device mentioned above, the buried layer and the well layer are commonly used in both the vertical registers and the horizontal register, it is impossible to select such an impurity concentration that maximum amount of charge transfer of the vertical registers is maintained while improving the transfer efficiency of the horizontal register. Therefore, maximum amount of signal charge can not be obtained for the vertical registers and the transfer efficiency is degraded for the horizontal register, resulting in degradation of image quality.

BRIEF SUMMARY OF THE INVENTION

Object of the Invention

A major object of the present invention is, therefore, to provide a charge transfer image pick-up device having high charge transfer efficiency while maintaining a wide dynamic range.

Another object of the present invention is to provide a charge transfer image pick-up device of, particularly, frame interline transfer type capable of providing high charge transfer efficiency.

Still another object of the present invention is to provide a method of manufacturing the charge transfer image pick-up device of the above-mentioned type, by which degradation of quality of a reproduced image due to insufficient charge transfer can be prevented.

Summary of the Invention

In a charge transfer image pick-up device according to the present invention, vertical registers and a horizontal register are constituted with buried channel CCDs, respectively. Well layers of the vertical registers and the horizontal register are formed separately from each other. The depth of the well layer of the vertical registers is smaller than that of the horizontal register and impurity concentration of the well layer of the vertical regitsers is larger than that of the horizontal register. The buried layer of the vertical registers is formed by a first buried layer which is connected to the buried layer of the horizontal register and a second buried layer formed on the first buried layer. Impurity concentration of the second buried layer is made larger than that of the first buried layer.

In the charge transfer image pick-up device according to the present invention, it is preferable that the well layer constituting the horizontal register extends into the vertical registers corresponding to non-effective light receiving regions, with width being gradually reduced. Such structure is particularly effective in the charge transfer device of the frame-interline type.

The method of manufacturing the charge transfer image pick-up device according to the present invention comprises the steps of forming, on a semiconductor substrate of one conductivity type, a well layer of the other conductivity type and forming, in the well layer, a first and second buried layers both of the one conductivity type. Final transfer electrodes of the vertical registers are formed of an electrode material of the semiconductor substrate and transfer electrodes of the horizontal and vertical registers are formed of electrode material of the well layer and the buried layers and the second buried layer of the vertical registers is formed in self-alignment with respect to the final transfer electrodes thereof.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE PREFERRED EMBODIMENTS

Figure 1:
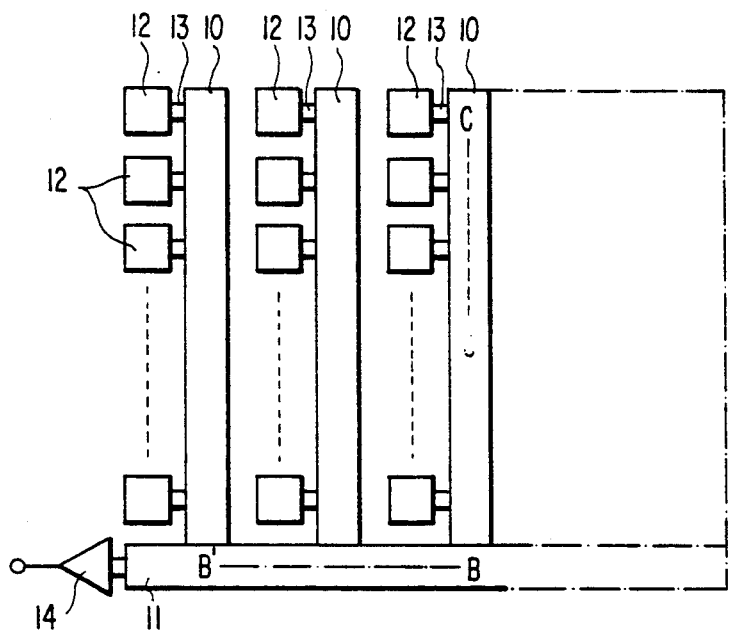
FIG. 1 is a schematic plan view of a general interline type charge transfer image pick-up device.

Referring to FIG. 1 which shows a general interline type charge transfer image pick-up device, the device is constituted with a plurality of vertical registers 10 each of CCDs, a plurality of photo-electric converters 12 arranged adjacent to respective registers of each vertical register in matrix, a plurality of transfer gates 13 each arranged between one of photo-electric converter 12 and a corresponding one of the registers constituting each vertical register 10 for controlling transfer of signal charge from the photo-electric converters 13 to the vertical registers 10, a horizontal register 11 electrically connected to one ends of the respective vertical registers 10 and a charge detector 14 provided at one end of the horizontal register 11.

Signal charges accumulated in the photo-electric converters 12 correspondingly to amounts of incident light during a predetermined time period are read in the vertical registers 10 by turning corresponding transfer gates 13 on for a vertical blanking period. By applying drive pulses to transfer electrodes (not shown) of the vertical registers 10 during a horizontal blanking period, the signal charges are transferred successively in parallel along the vertical registers and then, from the final transfer electrodes of the vertical registers 10, to the horizontal register 11. The signal charge transferred horizontally in the horizontal register during an effective video image period is converted into voltage by the charge detector 14 and output as a video image signal.

A charge transfer image pick-up device adaptable to the HDTV under development requires 1.3 millions to 2 millions pixels which is 5 to 8 times that of NTSC system. Due to reduction of unit pixel area caused by increased number of the pixels, maximum amount of signal charge of the vertical registers is reduced and hence dynamic range of the image pick-up device is restricted. Further, in a solid state image pick-up device for HDTV system, horizontal transfer frequency is about 25 to 59 MHz which is 2 to 4 times that of NTSC system. Therefore, transfer efficiency may be degraded.

The present invention was made to solve such technical problem.

Figure 2A:
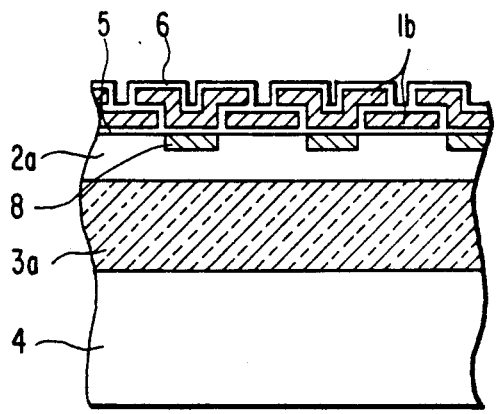
FIGS. 2(a) and 2(b) are cross section views of a horizontal register and vertical registers of a first embodiment of the present invention, respectively.
Figure 2B:
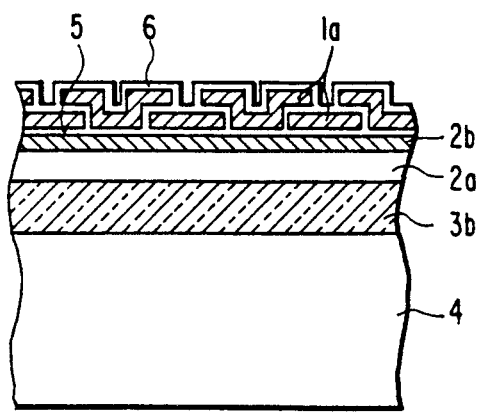

Referring to FIG. 2 which shows a cross section of a horizontal register (FIG. 2(a)) and vertical registers (FIG. 2(b)) of a charge transfer image pick-up device according to a first embodiment of the present invention, the horizontal register and the vertical registers are constituted with N channel, buried channel type CCDs formed by a P type well layer and an N type buried layer formed in an N type silicon substrate.

The horizontal register is formed by a first well layer 3a whose impurity distribution depth is large and whose impurity concentration is low and a first buried layer 2a formed in the first well layer 3a. By making impurity concentration of the well layer low, fringe electric field in a transfer direction becomes stronger, resulting in high transfer efficiency with which there may be no residual charge even at a high speed charge transfer.

On the other hand, the vertical register includes a second well layer 3b whose impurity distribution depth is smaller and impurity concentration is higher, compared with those of the first well layer 3a of the horizontal register. The buried layer of the vertical register is formed by a first buried layer 2a which is common for the horizontal register and a second buried layer 2b which is formed on the first buried layer 2a and whose impurity density is higher than that of the first buried layer 2a. Since the channel layers of the vertical registers are shallow as mentioned above, maximum amount of transfer charge per unit area is increased and thus it is possible to have a sufficiently large dynamic range.

Figure 3:
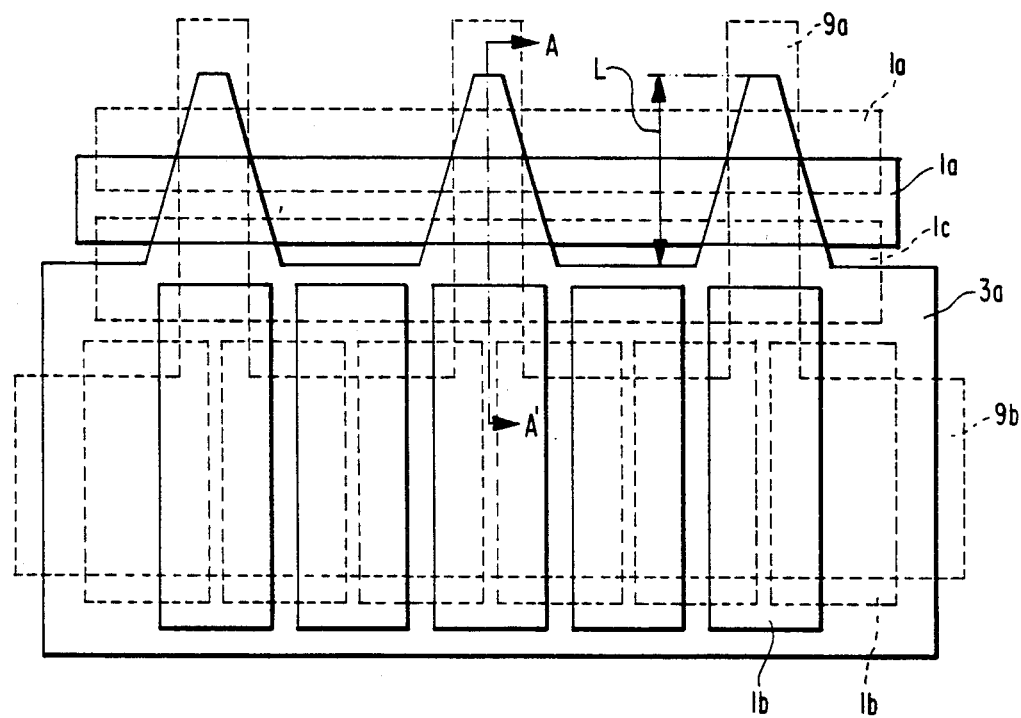
FIG. 3 is a plan view of a connecting portion between vertical registers and a horizontal register in a second embodiment of the present invention.

FIG. 3 is a plan view of a connection portion between vertical registers and a horizontal register according to a second embodiment of the present invention, showing a structure of a well layer in the connection portion. In FIG. 3, a reference numeral 9a depicts channels of the vertical registers, 1a transfer electrodes of the vertical registers, 9b a channel of the horizontal register and 1b transfer electrodes of the horizontal register. The feature of this embodiment resides in that the well layer 3a of the horizontal register extends into the vertical registers, with gradually reducing width.

Figure 4A:
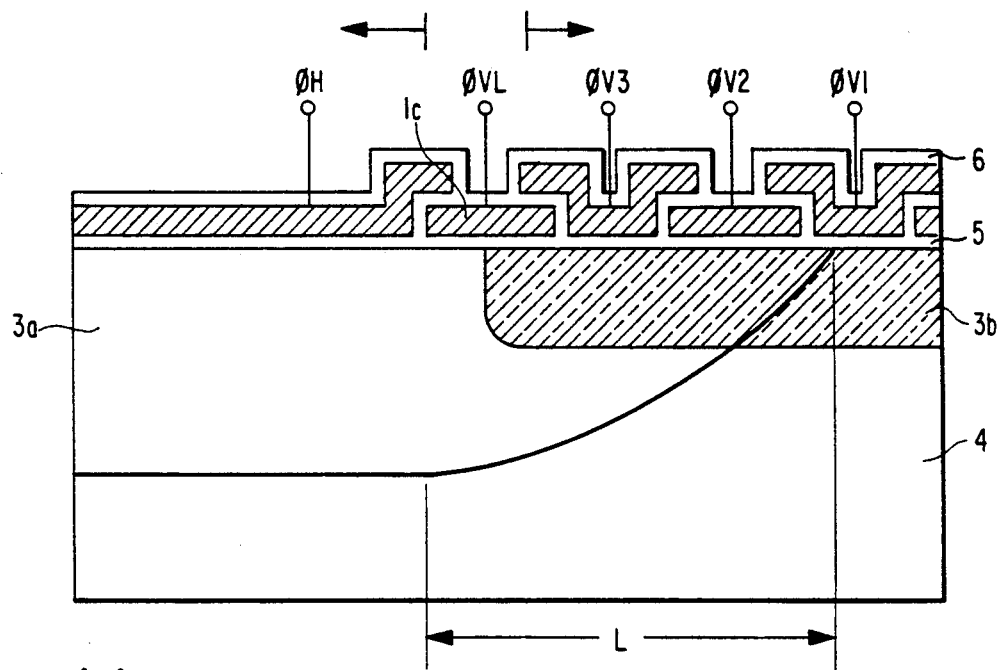
FIG. 4(a) is a cross section taken along a line A—A' in FIG. 3
Figure 4B:
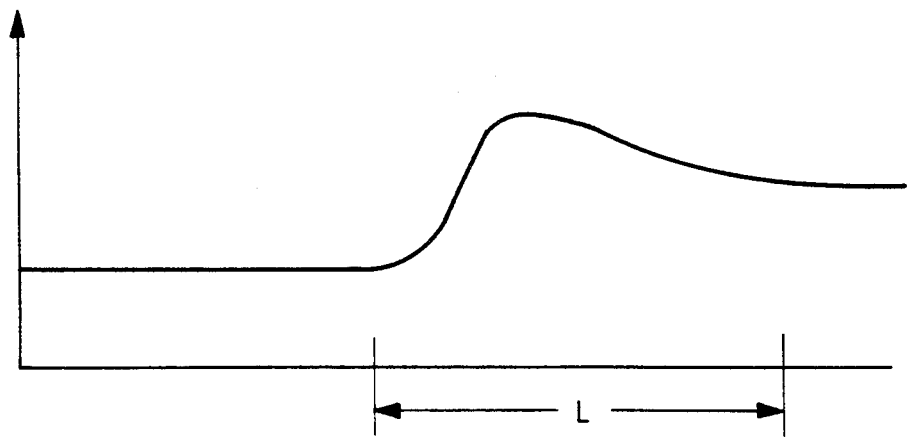
FIG. 4(b) illustrates an impurity distribution in a well layer.

Referring to FIGS. 4(a) and 4(b) which show a cross section taken along a line A—A' in FIG. 3 and an impurity density distribution in the well layer, respectively, when the wells of the horizontal register and the vertical registers are formed with mutually different impurity density distributions, a region L in which the first well layer 3a of the horizontal register and the second well layer 3b of the vertical register are overlapped is shallower than that in which only the second well 3b is formed. Therefore, potential of the first well 3a is lower than that in the second well layer 3b and thus there is produced a potential gradient preventing transfer along the charge transfer direction (from right to left on the drawing sheet), resulting in degraded charge transfer efficiency.

According to the present invention, the potential gradient is limited by forming the first well layer 3a such that it extends into the channel 9a of the vertical registers by length L while its width is gradually reduced from the side of the horizontal register, as shown in FIG. 3. The length L is preferably as long as possible in the vertical register corresponding to non-effective light receiving receiving rrgions so as to not affect the characteristics of the photo-electric converters. For example, it is possible to arbitrarily set the length L within the vertical registers between the non-effective light receiving regions and the horizontal register of the interline transfer type image pick-up device and within the vertical registers in storage regions of the frame interline transfer type image pick-up device having image regions and the storage regions.

As an example, it is assumed that impurity density of the first well $3a$ is $1 \times 10^{15} - 2 \times 10^{15}$ cm$^{-3}$, junction depth is $4-5$ μm, impurity density of the second well layer $3b$ is $5 \times 10^{15} - 1 \times 10^{16}$ cm$^{-3}$ and junction depth is $2-3$ μm, potential of a region in which the first well layer $3a$ and the second well layer $3b$ are overlapped is lower than that of the region in which only the second well layer $3b$ is formed by about 0.5 V. If the length of transfer electrode is 4 μm and the first well layer 3a is formed in the connection portion with uniform width, potential barrier of 0.5 V is formed below each electrode. Since this value is larger than thermal electromotive force of electron (26 mV) at normal temperature, electron can not pass through the barrier, resulting in transfer failure.

On the other hand, when the width of the first well layer 3a is gradually reduced over a length L of 100 um as shown in FIGS. 3 and 4, potential difference below each electrode becomes 20 mV which is smaller than thermal electromotive force of electron and therefore there is no transfer failure. In an interline transfer type solid state image pick-up device adaptable to HDTV of 1 inch format, the length 100 μm corresponds to 12 to 13 pixels which is realizable value. In a case of a frame interline transfer type image pick-up device, it is possible to make the value of L larger than 100 μm in which case potential difference below each electrode can be further reduced.

With the structure mentioned above it is possible to avoid degradation of charge transfer efficiency in the connecting portion between the vertical registers and the horizontal register which have mutually different well constructions.

Figure 5A:
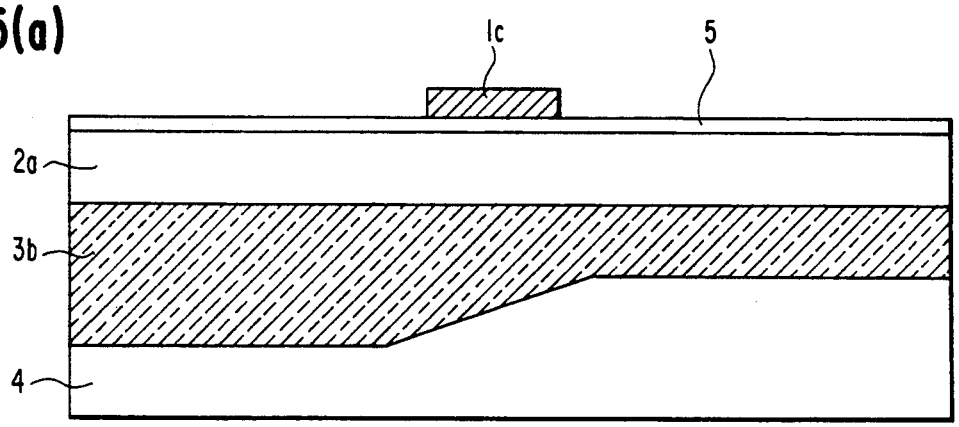
FIGS. 5(a) to 5(c) are cross section views showing manufacturing steps of buried layers of a charge transfer image pick-up device according to the present invention.
Figure 5B:
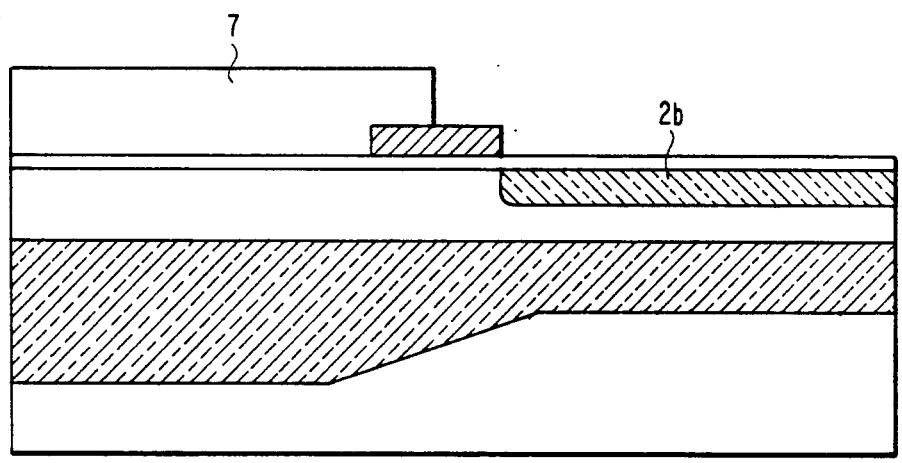
Figure 5C:
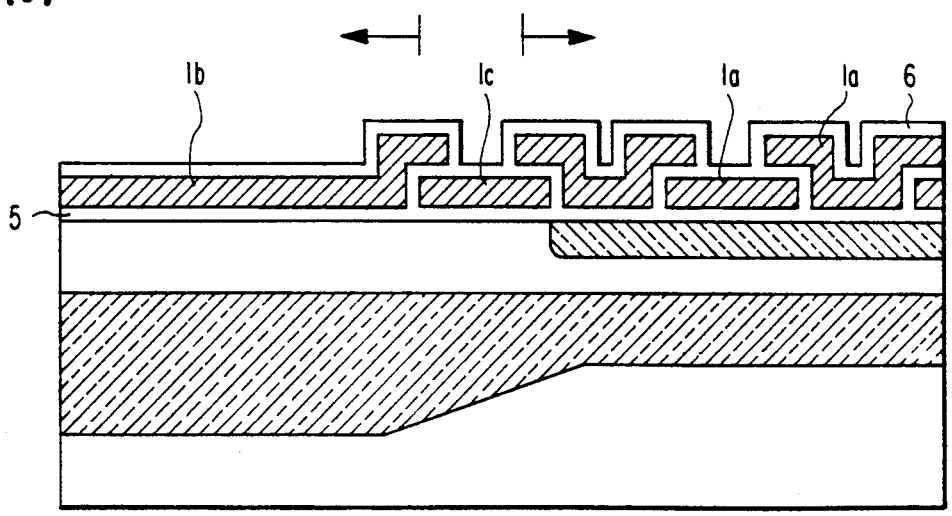

Referring to FIG. 5 which shows cross sections of the second buried layer in the vertical register of the third embodiment of the present invention along the manufacturing steps thereof, the first P type well layer 3a of the horizontal register and the second well layer 3b of the vertical register are formed on the N type semiconductor substrate 4 and the first N type buried layer 2a which is common for the horizontal register is formed thereon. Further, after a gate insulating film 5 is formed on a surface of the wafer a final transfer electrode 1c of the vertical register is formed by using a first poly-silicon layer (FIG. 5(a)).

Then, other area of the wafer than the vertical register area is covered by a photo-resist film 7 and the second buried layer 2b is formed in the vertical register area in self-alignment by ion injection (FIG. 5(b)). As a result, a boundary of the second buried layer 2b is aligned with an edge of the final electrode 1c.

By forming the second buried layer 2b in self-alignment with the vertical final transfer electrode in this manner, it is possible to avoid formation of potential barrier in transfer direction below the transfer electrode and thus it is possible to prevent charge transfer failure. It is possible to use other material than poly-silicon as the electrode material.

As mentioned above, in the image pick-up device according to the present invention, it is possible to form the buried layer and the well layer of the vertical and horizontal registers with optimum impurity distribution for respective registers. Therefore, it is possible to reliably hold a sufficient amount of transfer charge in the vertical registers and to obtain high transfer efficiency in the horizontal register even at high transfer frequency.

Further, in the case where the wells of the horizontal and vertical registers are formed with mutually different impurity distributions, it is possible to reduce the potential gradient in the well connection portion without affecting the characteristics of the photo-electric converters by gradually reducing the width of the first well layer of the horizontal register in the vertical registers corresponding to the non-effective light receiving region and thus it is possible to prevent the signal charge transfer efficiency from being degraded.

Further, it is possible to prevent formation of potential barrier below the transfer electrode by forming the second buried layer of the vertical register in self-aligned manner with respect to the final electrode of the vertical register and therefore it is possible to prevent degradation of reproduced image quality due to transfer failure of signal charge.

Although the present invention has been described with reference to a specific embodiment or embodiments, this description is not meant to be construed in a limiting sense. Various modifications of the disclosed embodiment will becomes apparent to persons skilled in the art upon reference to the description of the invention. It is therefore contemplated that the appended claims will cover any modifications or embodiments as fall within the true scope of the invention.

What is claimed is:

1. A charge transfer image pick-up device comprising a semiconductor substrate of one conductivity type and vertical and horizontal registers, each of said registers being constituted with a well layer of an opposite conductivity type formed in said semiconductor substrate and a buried layer of said one conductivity type formed in said well layer, said well layer of said vertical register having an impurity concentration higher than the impurity concentration of said well layer of said horizontal register, said buried layer of said vertical register being constituted with a first buried layer which is connected to said buried layer of said horizontal register and a second buried layer formed on said first buried layer, and said second buried layer having an impurity concentration higher than the impurity concentration of said first buried layer.

2. The charge transfer image pick-up device as claimed in claim 1, wherein said well layer of said horizontal register extends into a non-effective light receiving region in a connecting portion between said vertical register and said horizontal register, with width being gradually reduced.

* * * * *